United States Patent
Miller et al.

(10) Patent No.: US 10,496,594 B1
(45) Date of Patent: Dec. 3, 2019

(54) INTER-PROCESSOR COMMUNICATION METHOD FOR ACCESS LATENCY BETWEEN SYSTEM-IN-PACKAGE (SIP) DIES

(71) Applicant: NXP USA, Inc., Austin, TX (US)

(72) Inventors: Gary L. Miller, Austin, TX (US);
Jeffrey Freeman, Austin, TX (US);
Huy Nguyen, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/995,983

(22) Filed: Jun. 1, 2018

(51) Int. Cl.
| | |
|---|---|
| G06F 15/17 | (2006.01) |
| G06F 13/42 | (2006.01) |
| G06F 9/38 | (2018.01) |
| G06F 15/78 | (2006.01) |

(52) U.S. Cl.
CPC ............ *G06F 15/17* (2013.01); *G06F 9/3885* (2013.01); *G06F 13/42* (2013.01); *G06F 15/7807* (2013.01); *G06F 2205/063* (2013.01)

(58) Field of Classification Search
CPC . G06F 9/38; G06F 13/42; G06F 15/17; G06F 15/78
See application file for complete search history.

(56) References Cited

U.S. PATENT DOCUMENTS

| | | | |
|---|---|---|---|
| 5,948,089 | A | 9/1999 | Wingard et al. |
| 2011/0134705 | A1 | 6/2011 | Jones et al. |
| 2011/0320669 | A1 | 12/2011 | Scandurra et al. |
| 2013/0089098 | A1* | 4/2013 | Mital ...................... H04L 69/22 370/394 |
| 2014/0307748 | A1* | 10/2014 | Wagh ..................... G06F 13/385 370/476 |
| 2015/0249602 | A1* | 9/2015 | Barner .................... H04L 45/72 370/389 |
| 2016/0344629 | A1* | 11/2016 | Gray ....................... H04L 45/60 |

FOREIGN PATENT DOCUMENTS

| | | |
|---|---|---|
| EP | 2278757 A1 | 1/2011 |
| EP | 2330514 A1 | 6/2011 |
| GB | 2473505 A | 3/2011 |
| WO | 2017120270 A1 | 7/2017 |

OTHER PUBLICATIONS

Non-Final Office Action on U.S. Appl. No. 15/995,881, dated May 31, 2019, 17 pages.
Notice of Allowance on U.S. Appl. No. 15/995,881, dated Sep. 24, 2019, 12 pages.

* cited by examiner

*Primary Examiner* — Eric T Oberly

(57) ABSTRACT

A system and method wherein die-to-die communication are provided between a first die and a second die contained in a common integrated circuit (IC) package, a first processor on the first die communicatively coupled to the first connectivity circuitry by the first processor bus and configured to provide first bus transactions, to be provided to the second connectivity circuitry, to the first processor bus, the first connectivity circuitry configured to utilize a multiple simultaneous outstanding transaction capability supporting multiple simultaneous outstanding write transactions concurrent with multiple simultaneous outstanding read transactions, the second connectivity circuitry configured to provide processor bus flow control information and elasticity buffer status information pertaining to the elasticity buffer to the first connectivity circuitry via a common message for flow control.

17 Claims, 4 Drawing Sheets

INTER-PROCESSOR COMMUNICATION METHOD FOR ACCESS LATENCY BETWEEN SYSTEM-IN-PACKAGE (SIP) DIES

CROSS-REFERENCE TO RELATED APPLICATION(S)

The present application is related to co-pending U.S. patent application Ser. No. 15/995,881, entitled "INTER-PROCESSOR COMMUNICATION AND SIGNALING SYSTEM AND METHOD" filed on Jun. 1, 2018, the entirety of which is herein incorporated by reference.

BACKGROUND

Field of the Disclosure

The present disclosure relates generally to electronic systems and methods and, more particularly, to electronic communication systems and methods.

Background of the Disclosure

Trends in the semiconductor industry are leading to a migration toward system-in-package (SiP) products. SiPs allow for new paradigms of optimization to solve trade-offs of leakage, performance, capability and cost. They can be used to manage scheduling and processing task complexity using a divide-and-conquer strategy.

However, SiPs also present new challenges. One of the challenges is to provide hardware-controlled inter-processor communication (IPC) between die via a single high-speed serial die-to-die interface, while achieving minimal access latencies.

Hardware-controlled IPC is very desirable, and may be thought of as a virtual interconnection of bus fabrics between die. That is, hardware-level bus fabrics, such as advanced microprocessor bus architecture (AMBA) advanced extensible interface (AXI), are virtually interconnected from one die to the other in a way to enable directly transporting AXI transactions between die, without the need for software intervention. To transport AXI transactions between die transaction information is packetized into messages that can accurately reproduce the whole transaction on the other die.

In real-time applications, where many accesses are required in a time-sensitive control loop, accesses to slaves on another die in a SiP should be minimized. An illustrative example is a brake pressure actuator control loop time of 100 microseconds. The control loop tasks include read accesses to wheel speed sensor data, control system calculations with the wheel speed data, and then write accesses to adjust control of direct-current (DC) brushless motors.

Typical single access latencies for high speed serial interfaces are hundreds of nanoseconds. Burst accesses help to improve access latencies, but are dependent upon accessing compatible slaves such as memories. To enable more applications, however, the challenge is to achieve latencies that approach on-chip access times for both single and burst accesses (i.e., in the tens of nanoseconds). Previous technology has been lacking in respects discussed above.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
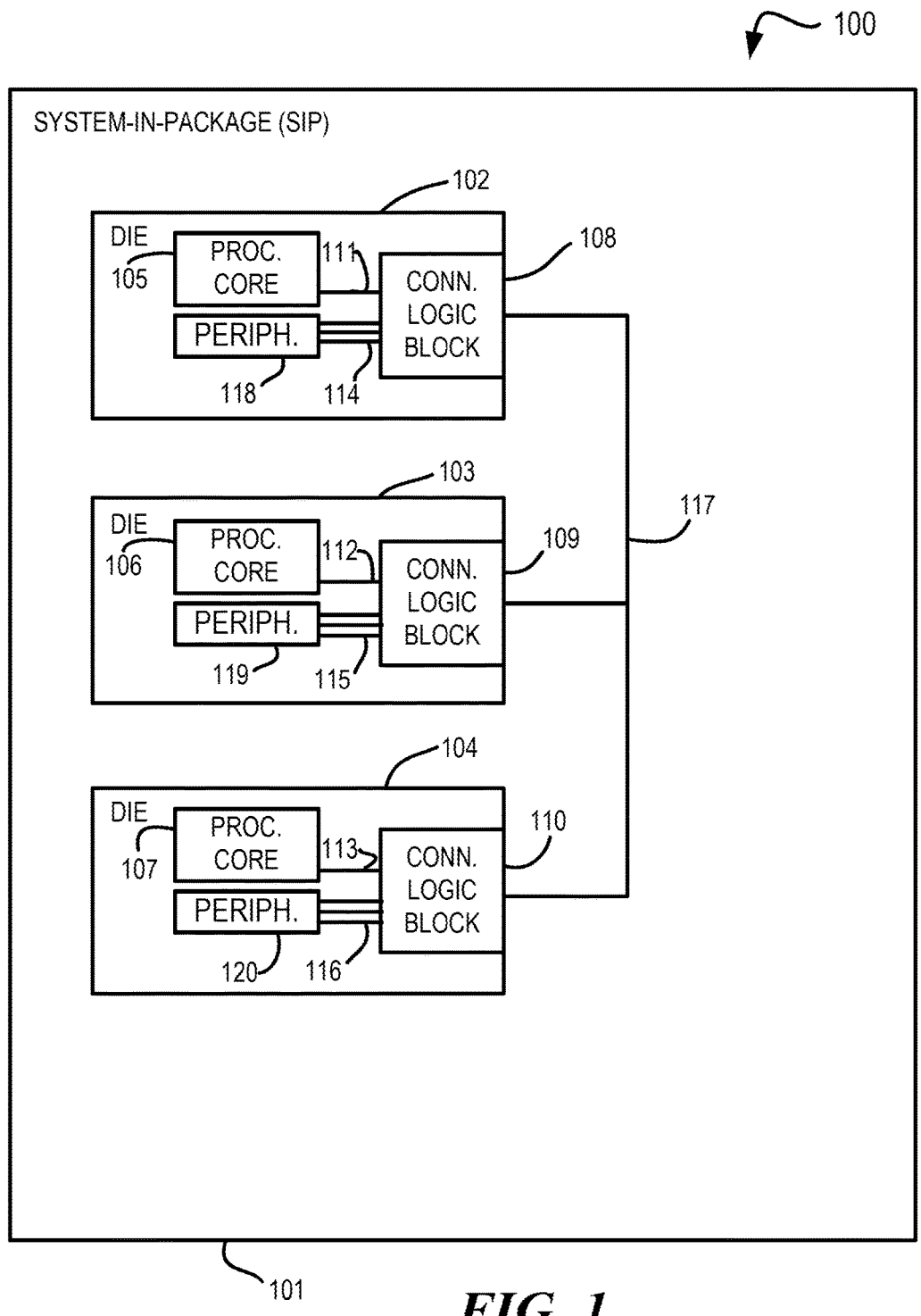
FIG. 1 is an open-package plan view of a system-in-package (SiP) system in accordance with at least one embodiment.

In accordance with at least one embodiment, an inter-processor communication and signaling system and method are provided. The system and method can convey processor bus communications as die-to-die message packets over a die-to-die interconnect between a first semiconductor die and a second semiconductor die with multiple outstanding transaction capability and flow control. The first semiconductor die and the second semiconductor die can be disposed within a common integrated circuit (IC) package.

A processor bus on each die is connected to processor communication logic block, which may be implemented, for example, as connectivity circuitry. The processor communication logic block on each die is interconnected to one or more others via die-to-die assembly techniques. On-die processor bus transactions are converted into message packets and communicated to the other die. Low latency requirements for die-to-die processor communication are managed using a relationship of multiple flow control mechanisms, message classifications, classification-specific processing, and look-ahead flow acceleration mechanisms.

One practiced in the art of high-speed serial interfaces will understand the significant challenges of designing an IPC flow control (FC) method for minimizing access latencies for both single and burst accesses. Standard flash interfaces are optimized for burst access of 16 only, which is not usable for control system or general applications.

A die-to-die IPC flow acceleration mechanism to achieve minimal access time for both single and burst accesses has been a heretofore unmet need. As stated above the challenge for high-speed serial interfaces is to achieve latencies that approach on-chip access times for both single and burst accesses.

In accordance with at least one embodiment, an IPC bus on each die is connected to an on-die die-to-die serial communication circuit. As an example, the IPC bus can be an advanced microprocessor bus architecture (AMBA) advanced extensible interface (AXI) bus. The on-die die-to-die serial communication circuit on each die is interconnected to one or more others via die-to-die assembly techniques. On-die IPC bus transactions are converted into message packets and communicated to the other die or dies.

Firstly, two flow control mechanisms are employed in a manner for gaining minimal latency. An IPC bus protocol is used for flow control to take optimal advantage of multiple outstanding transaction capabilities, allowing simultaneous outstanding transactions, such as many (e.g., eight) outstanding reads and many (e.g., eight) outstanding writes to have been started but not yet finished at the same time. An elasticity buffer (EB) flow control pertaining to IPC bus messages is used to signal EB status on other die or dies. To help achieve acceleration of die-to-die IPC bus transmissions for gaining minimal, sustained access latency, a capability relationship between the two independent flow control is established (e.g., eight outstanding transmissions allowed and 128 bytes for the EB).

Secondly, to minimize bandwidth needs for flow control, two message classifications are utilized. IPC bus messages are provided containing IPC bus protocol and EB flow control information. Flow control messages are provided containing EB flow control information. To help achieve acceleration of die-to-die IPC bus transmissions, message transmission of the latter type does not preclude or prevent IPC bus message transmission.

Thirdly, there are dual classification-specific processing pipelines to help achieve acceleration of die-to-die IPC bus transmissions. A splitter is used for incoming messages to partition the messages into an appropriate specific pipeline of multiple specific pipelines (e.g., using the first bit of the message identifier (ID)). The features described below are provided to support the different characteristics. IPC bus message pipeline processing time is quite varied, as it depends upon how fast or slow the slave is, as well as if it is a single or burst access.

IPC bus EB flow control message pipeline processing time is guaranteed to be limited to a specified finite amount of time, such as one clock cycle. The timing of communication of EB flow control messages can be independent from factors affecting the IPC bus latency, thereby expediting new access starts and reducing latency. Each pipeline can be provided with an independent EB. Thus, there can be an IPC bus EB and a FC EB.

Fourthly, to reduce or eliminate bus stall and bus lock conditions, look-ahead flow acceleration can be employed to pre-fetch EB flow control information from the IPC bus EB. Such pre-fetching can remove dependency of the EB flow control information waiting on valid/ready IPC bus handshaking. Such pre-fetching can also expedite new access starts and reduce latency.

Processor bus flow control information and elasticity buffer information can both be included in IPC bus messages or can be sent by a different type of message. EB flow control information can be converted into a common message that includes processor bus flow control information in addition to the EB flow control information.

The result of these features can improve die-to-die access time to approach the access time of the slave on the other die. Such improved performed can be observed for single and burst access from the source die that occur within a periodicity of the slave access time on the other die. That is, if the access time of the slave on the other die is, for example, 25 nanoseconds, then average die-to-die access time for this scenario could approach 25 nanoseconds.

As noted above, at least one embodiment can provide technological improvement of performance of die-to-die communications. One or more features, such as the above-described multiple flow control mechanisms, multiple message classifications, multiple processing pipelines, and the pre-fetching of elasticity buffer flow control information for look-ahead flow acceleration can improve die-to-die access time. Die-to-die access time can be very important to system-in-package (SiP) performance, as excessive die-to-die access time can create a communications bottleneck or result in improper operation if important messages are not received in a timely manner. Thus, the improvements provided by the techniques described herein can make a difference between operability and inoperability or between commercial viability and non-viability.

FIG. 1 is an open-package plan view of a system-in-package (SiP) system in accordance with at least one embodiment. System 100 comprises SiP 101. SiP 101 comprises die 102, die 103, and die 104. Die 102 comprises processor core 105 and connectivity logic block 108, connectivity logic block 108 comprising connectivity circuitry. Processor core 105 is connected to connectivity logic block 108 via processor bus 111. Peripherals 118 are connected to connectivity logic block 108 via discrete signal lines 114. Die 103 comprises processor core 106 and connectivity logic block 109, connectivity logic block 109 comprising connectivity circuitry. Processor core 106 is connected to connectivity logic block 109 via processor bus 112. Peripherals 119 are connected to connectivity logic block 109 via discrete signal lines 115. Die 104 comprises processor core 107 and connectivity logic block 110. Processor core 107 is connected to connectivity logic block 110 via processor bus 113. Peripherals 120 are connected to connectivity logic block 110 via discrete signal lines 116. Connectivity logic block 108, connectivity logic block 109, and connectivity logic block 110 are connected to each other via interconnect 117.

Discrete signaling events (scalar or vector) can occur on discrete signal lines 114, 115, and 116. A scalar discrete signaling event contains a single element being communicated. For instance, a single conductor conveying a single signal having a particular signaling value of a plurality of different signaling values that can be expressed by different signal amplitudes (e.g., logic levels, voltages, currents, etc.) is an example of a scalar discrete signaling event. A vector discrete signaling event contains one or more elements, arranged in parallel. For instance, two or more conductors each conveying a signal, each signal having a respective particular signaling value of a plurality of different signaling values that can be expressed by different signal amplitudes (e.g., logic levels, voltages, currents, etc.) is an example of a vector discrete signaling event. By contrast, a processor bus conveys higher bandwidth data of a general nature between processors, as opposed to the lower bandwidth particular signaling values of signals of discrete signal lines.

Scalar discrete signaling events and vector discrete signaling events can be understood in the context of the destination domain to which signals representative of them are delivered. For a scalar discrete signaling event, a signaling event on an individual signal line is not recombined with a signaling event on another individual signal line in the destination domain. For a vector discrete signaling event, a signaling event on an individual signal line is recombined with a signaling event on another individual signal in the destination domain to recover information conveyed across the combination of the individual signal lines. For Gray-coded vector signaling events, two or more bits are recombined in the destination domain with timing issues avoided using Gray coding. Gray coding allows only one of the signal lines to change at any particular time. Gray coding can avoid temporary indeterminate states arising from temporal skew among multiple signal lines. For qualifier-based vector signaling events, two or more bits are recombined in the destination domain with timing issues avoided using a qualifier. The qualifier waits until the signals conveyed by all relevant individual signal lines have settled before determining a values of the signaling event (e.g., before latching the data into a register in the destination domain).

Figure 2:
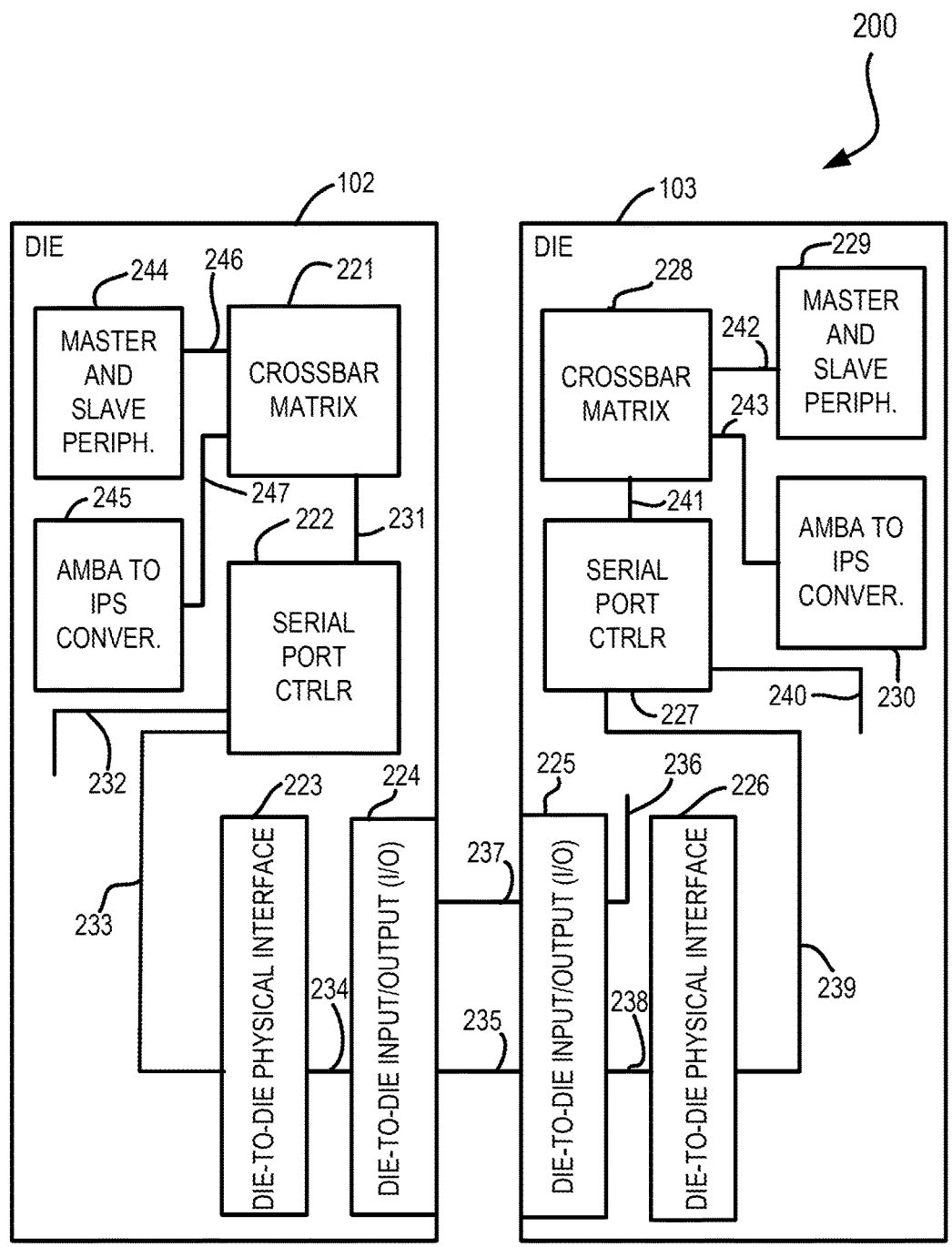
FIG. 2 is a block diagram illustrating a system in accordance with at least one embodiment.

FIG. 2 is a block diagram illustrating a system in accordance with at least one embodiment. System 200 comprises die 102 and die 103. Die 102 comprises crossbar matrix 221, serial port controller 222, die-to-die physical interface 223, and die-to-die input-output (I/O) circuit 224, as well as a processor core, such as processor core 105, and peripherals, such as peripherals 118. Die 103 comprises master and slave peripherals 229, IPC bus conversion circuit 230 (e.g., an advanced microprocessor bus architecture (AMBA) conversion circuit), crossbar matrix 228, serial port controller 227, die-to-die physical interface 226, and die-to-die input-output (I/O) circuit 225.

Crossbar matrix 221 is connected to serial port controller 222 via bus access interconnect 231. Discrete signal lines 232 are connected to serial port controller 222. Serial port controller 222 is connected to die-to-die physical interface 223 via interconnect 233. Die-to-die physical interface 223 is connected to die-to-die I/O circuit 224 via interconnect 234. Die-to-die I/O circuit 224 of die 102 is connected to die-to-die I/O circuit 225 of die 103 via die-to-die serial interconnect 235. Reference voltage Vddref 236 is connected to die-to-die I/O circuit 225. Reference voltage Vddref 237 is connected from die-to-die I/O circuit 225 to die-to-die I/O circuit 224. Die-to-die I/O circuit 225 is connected to die-to-die physical interface 226 via interconnect 238. Die-to-die physical interface is connected to serial port controller 227 via interconnect 239. Discrete signal lines 240 are connected to serial port controller 227. Serial port controller 227 is connected to crossbar matrix 228 via interconnect 241. Crossbar matrix 228 is connected to IPC bus conversion circuit 230 via interconnect 243. Crossbar matrix 228 is connected to master and slave peripherals 229 via interconnect 242.

Figure 3:
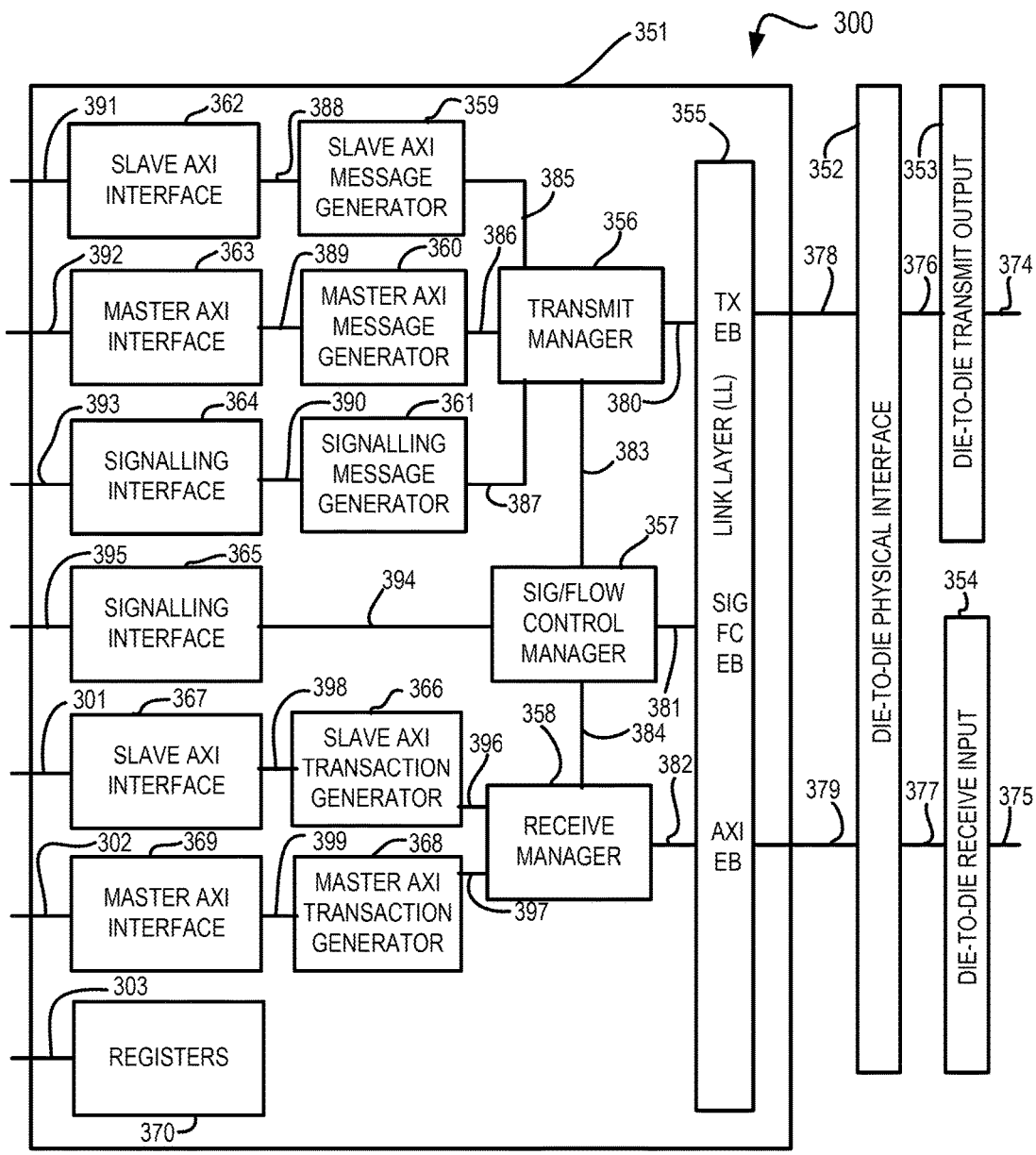
FIG. 3 is a block diagram illustrating a die implementing a system in accordance with at least one embodiment.

FIG. 3 is a block diagram illustrating a die implementing a system in accordance with at least one embodiment. Die 300 of the system comprises processing circuitry 351, die-to-die physical interface 352, die-to-die transmit input-output (I/O) circuit 353, and die-to-die receive input-output (I/O) circuit 354. Processing circuitry 351 comprises link layer (LL) circuit 355, transmit manager 356, signaling and flow control manager 357, receive manager 358, slave IPC bus message generator 359 (e.g., a slave advanced extensible interface (AXI) message generator), slave IPC bus circuit 362 (e.g., a slave AXI circuit), master IPC bus message generator 360 (e.g., a master AXI bus message generator), master IPC bus circuit 363 (e.g., a master AXI bus circuit, signaling message generator 361, signaling interface 364, signaling interface 365, slave IPC bus transaction generator 366 (e.g., a slave AXI transaction generator), slave IPC bus circuit 367 (e.g., a slave AXI circuit), master IPC bus transaction generator 368 (e.g., a master AXI transaction generator), master IPC bus circuit 369 (e.g., a master AXI circuit), and registers 370.

Interconnect 391 is connected to slave IPC bus circuit 362. Slave IPC bus circuit 362 is connected to slave IPC bus message generator 359 via interconnect 388. Slave IPC bus message generator 359 is connected to transmit manager 356 via interconnect 385. Interconnect 392 is connected to master IPC bus circuit 363. Master IPC bus circuit 363 is connected to master IPC bus message generator 360 via interconnect 389. Master IPC bus message generator 360 is connected to transmit manager 356 via interconnect 386. Interconnect 393 is connected to signaling interface 364. Signaling interface 364 is connected to signaling message generator 361 via interconnect 390. Signaling message generator 361 is connected to transmit manager 356 via interconnect 387. Transmit manager 356 is connected to link layer circuit 355 via interconnect 380. Link layer circuit 355 of processing circuitry 351 is connected to die-to-die physical interface 352 via interconnect 378. Die-to-die physical interface 352 is connected to die-to-die transmit I/O circuit 353 via interconnect 376. Die-to-die transmit I/O circuit 353 is connected to interconnect 374.

Transmit manager 356 is connected to signaling and flow control manager 357 via interconnect 383. Signaling and flow control manager 357 is connected to signaling interface 365 via interconnect 394. Signaling interface 365 is connected to interconnect 395. Signaling and flow control manager 357 is connected to receive manager 358 via interconnect 384. Signaling and flow control manager 357 is connected to link layer circuit 355 via interconnect 381.

Interconnect 375 is connected to die-to-die receive I/O circuit 354. Die-to-die receive I/O circuit 354 is connected to die-to-die physical interface 352 via interconnect 377. Die-to-die physical interface 352 is connected to link layer circuit 355 of processing circuitry 351 via interconnect 379. Link layer circuit 355 is connected to receive manager 358 via interconnect 382. Receive manager 358 is connected to slave IPC bus transaction generator 366 via interconnect 396. Slave IPC bus transaction generator 366 is connected to slave IPC bus circuit 367 via interconnect 398. Interconnect 301 is connected to slave IPC bus circuit 367. Receive manager 358 is connected to master IPC bus transaction generator 368 via interconnect 397. Master IPC bus transaction generator 368 is connected to master IPC bus circuit 369 via interconnect 399. Interconnect 302 is connected to master IPC bus circuit 369.

While both slave and master components are illustrated in processing circuitry 351, a master device can be implemented without the slave components, a slave device can be implemented without the master components, or a selectable master and slave device can be implemented as illustrated. Link layer circuit 355 comprises elastic buffers to support communications. For example, link layer circuit 355 is shown as comprising a transmit elastic buffer (TX EB), a receive elastic buffer (AXI EB or RX EB), and a signaling and flow control elastic buffer (SIG FC EB).

Figure 4:
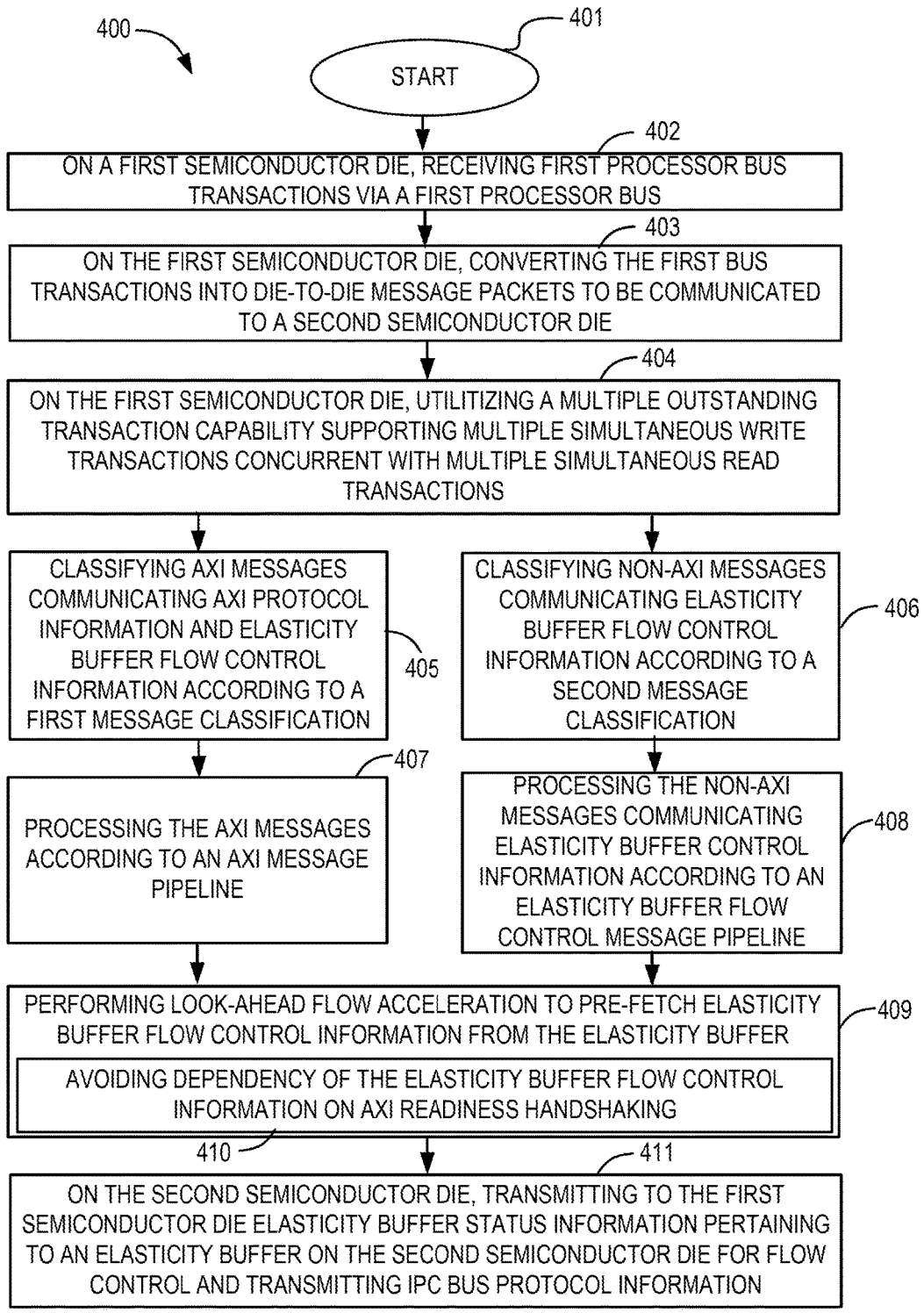
FIG. 4 is a flow diagram illustrating a method in accordance with at least one embodiment.

FIG. 4 is a flow diagram illustrating a method in accordance with at least one embodiment. Method 400 begins at block 401 and continues to block 402. At block 402, on a first semiconductor die, first connectivity circuitry receives first processor bus transactions via a first processor bus. From block 402, method 400 continues to block 403. At block 403, on the first semiconductor die, the first connectivity circuitry converts the first bus transactions into die-to-die message packets to be communicated to a second semiconductor die via a die-to-die interconnect. From block 403, method 400 continues to block 404. At block 404, on the first semiconductor die, the first connectivity circuitry utilizes a multiple outstanding transaction capability supporting multiple simultaneous outstanding write transactions concurrent with multiple simultaneous outstanding read transactions. The multiple simultaneous outstanding transaction capability, which can be referred to as a split transaction capability, allows, for example, a read transaction to be split into a read request requesting data to be read and a read response providing the data that has been read. The splitting of the read transaction into a read request and a read response that can be communicated at different times allows other transactions or portions thereof to be communicated in the interim. If multiple read requests have been communicated before their respective read responses have been communicated, those multiple read transactions remain outstanding at the same time. A similar situation can occur with multiple components of a write transaction that may occur at different times. Thus, multiple write transactions can remain outstanding simultaneously.

From block 404, method 400 continues to block 405 for IPC bus messages (e.g., AXI messages) and to block 406 for non-IPC-bus messages (e.g., non-AXI messages). At block 405, second connectivity circuitry on the second semiconductor die classifies IPC bus messages communicating IPC bus protocol information and elasticity buffer flow control information according to a first message classification. From block 405, method 400 continues to block 407. At block 407, the second connectivity circuitry on the second semiconductor die processes the IPC bus messages according to an IPC bus message pipeline. At block 406, the second connectivity circuitry classifies non-IPC-bus messages communicating elasticity buffer flow control information but not IPC bus protocol information according to a second message classification. From block 406, method 400 continues to block 408. At block 408, the second connectivity circuitry on the second semiconductor die processes the non-IPC-bus messages communicating elasticity buffer control information according to an elasticity buffer flow control message pipeline. In accordance with at least one embodiment, the IPC bus message pipeline provides a varied processing time to process the IPC bus messages, and the elasticity buffer flow control message pipeline provides a constrained amount of processing time to process the non-IPC-bus messages. From either of block 407 or block 408, method 400 continues to block 409.

At block 409, the second connectivity circuitry on the second semiconductor die performs look-ahead flow acceleration to pre-fetch the elasticity buffer flow control information from the elasticity buffer. In accordance with at least one embodiment, block 409 comprises block 410. At block 410, the look-ahead flow acceleration avoids dependency of the elasticity buffer flow control information on IPC bus readiness handshaking. From block 409 or block 410, method 400 continues to block 411. At block 411, on the second semiconductor die, the second connectivity circuitry transmits to the first semiconductor die elasticity buffer status information pertaining to an elasticity buffer on the second semiconductor die for flow control. In accordance with at least one embodiment, IPC bus messages, such as advanced microprocessor bus architecture (AMBA) advanced extensible interface (AXI) bus messages, are used for one portion of the flow control (EB status is the other portion of overall flow control). In accordance with at least one embodiment, the first semiconductor die and the second semiconductor die are contained in a common integrated circuit (IC) package.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The terms "substantially," "about," and their variants, as used herein are intended to refer to the qualified article being sufficient to achieve the stated purpose or value in a practical manner, which includes taking into account any minor imperfections or deviations, if any, that arise from usual and expected abnormalities that may occur during device operation, which are not significant for the stated purpose or value. In addition, the term "substantially" has further been defined herein in the context of specific attributes to identify specific ranges.

What is claimed is:

1. A system comprising:
   a first semiconductor die comprising
      a first processor,
      first connectivity circuitry, and
      a first processor bus coupled to the first processor and to the first connectivity circuitry
   a second semiconductor die comprising
      second connectivity circuitry, the second connectivity circuitry comprising an elasticity buffer,
   the first die and the second die contained in a common integrated circuit (IC) package, the first processor communicatively coupled to the first connectivity circuitry by the first processor bus and configured to provide first bus transactions, to be provided to the second connectivity circuitry, to the first processor bus, the first connectivity circuitry configured to utilize a multiple simultaneous outstanding transaction capability supporting multiple simultaneous outstanding write transactions concurrent with multiple simultaneous outstanding read transactions, the second connectivity circuitry configured to provide processor bus flow control information and elasticity buffer status information pertaining to the elasticity buffer to the first connectivity circuitry for flow control,
wherein two message classifications are used for the flow control, the two message classifications comprising:
a first message classification for processor bus interface messages communicating processor bus interface protocol information and elasticity buffer flow control information; and
a second message classification for non-processor-bus-interface AXI messages communicating elasticity buffer flow control information.

2. The system of claim 1 wherein processor bus interface messages are used for the flow control.

3. The system of claim 1 wherein the second semiconductor die comprises:
a processor bus interface message pipeline for processing the processor bus interface messages; and
an elasticity buffer flow control message pipeline for processing the non-processor-bus-interface messages communicating elasticity buffer flow control information.

4. The system of claim 3 wherein the processor bus interface message pipeline provides a varied processing time to process the processor bus interface messages, and the elasticity buffer flow control message pipeline provides a constrained amount of processing time to process the non-processor-bus-interface messages.

5. The system of claim 1 wherein look-ahead flow acceleration is provided to pre-fetch the elasticity buffer flow control information from the elasticity buffer.

6. The system of claim 5 wherein the look-ahead flow acceleration avoids dependency of the elasticity buffer flow control information on processor bus interface readiness handshaking.

7. A method comprising:
on a first semiconductor die, receiving first processor bus transactions via a first processor bus;
on the first semiconductor die, converting the first bus transactions into die-to-die message packets to be communicated to a second semiconductor die via a die-to-die interconnect;
on the first semiconductor die, utilizing a multiple simultaneous outstanding transaction capability supporting multiple simultaneous outstanding write transactions concurrent with multiple simultaneous outstanding read transactions;
on the second semiconductor die, transmitting to the first semiconductor die process bus flow control information and elasticity buffer status information pertaining to an elasticity buffer on the second semiconductor die for flow control, the first semiconductor die and the second semiconductor die contained in a common integrated circuit (IC) package;
classifying processor bus interface messages communicating processor bus interface protocol information and elasticity buffer flow control information according to a first message classification; and
classifying non-processor-bus-interface messages communicating elasticity buffer flow control information according to a second message classification.

8. The method of claim 7 wherein processor bus interface messages are used for the flow control.

9. The method of claim 7 further comprising:
processing the processor bus interface messages according to a processor bus interface message pipeline; and
processing the non-processor-bus-interface messages communicating elasticity buffer control information according to an elasticity buffer flow control message pipeline.

10. The method of claim 9 wherein the processor bus interface message pipeline provides a varied processing time to process the processor bus interface messages, and the elasticity buffer flow control message pipeline provides a constrained amount of processing time to process the non-processor-bus-interface messages.

11. The method of claim 7 further comprising:
performing look-ahead flow acceleration to pre-fetch the elasticity buffer flow control information from the elasticity buffer.

12. The method of claim 11 wherein the look-ahead flow acceleration avoids dependency of the elasticity buffer flow control information on processor bus interface readiness handshaking.

13. Apparatus comprising:
a common integrated circuit (IC) package;
a first processor on a first semiconductor die, the first semiconductor die contained in the common IC package;
a second processor on a second semiconductor die, the second semiconductor die contained in the common IC package;
first connectivity circuitry on the first semiconductor die, the first connectivity circuitry connected to the first processor via a first processor bus, the first connectivity circuitry configured to convert first processor bus transactions on the first processor bus into die-to-die message packets for communication via a die-to-die interconnect, the first connectivity circuitry further configured to utilize a multiple simultaneous outstanding transaction capability supporting multiple simultaneous outstanding write transactions concurrent with multiple simultaneous outstanding read transactions;
second connectivity circuitry on the second semiconductor die, the second connectivity circuitry connected to the die-to-die interconnect for receiving the die-to-die message packets, the second connectivity circuitry connected to the second processor via a second processor bus, the second connectivity circuitry configured to convert the die-to-die message packets into second processor bus transactions on the second processor bus, the second connectivity circuitry further configured to provide processor bus flow control information and elasticity buffer status information pertaining to an elasticity buffer in the second connectivity circuitry to the first connectivity circuitry for flow control,
wherein two message classifications are used for the flow control, the two message classifications comprising:
a first message classification for processor bus interface messages communicating processor bus interface protocol information and elasticity buffer flow control information; and
a second message classification for non-processor-bus-interface messages communicating elasticity buffer flow control information.

14. The apparatus of claim 13 wherein processor bus interface messages are used for the flow control.

15. The apparatus of claim 13 wherein the second semiconductor die comprises:
a processor bus interface message pipeline for processing the processor bus interface messages; and an elasticity buffer flow control message pipeline for processing the non-processor-bus-interface messages communicating elasticity buffer flow control information.

16. The apparatus of claim 15 wherein the processor bus interface message pipeline provides a varied processing time to process the processor bus interface messages, and the elasticity buffer flow control message pipeline provides a constrained amount of processing time to process the non-processor-bus-interface messages.

17. The apparatus of claim 13 wherein look-ahead flow acceleration is provided to pre-fetch the elasticity buffer flow control information from the elasticity buffer.

* * * * *